(12) United States Patent
Tanaka et al.

(10) Patent No.: US 9,296,068 B2
(45) Date of Patent: Mar. 29, 2016

(54) LASER IRRADIATION METHOD AND LASER IRRADIATION APPARATUS

(75) Inventors: Koichiro Tanaka, Isehara (JP); Yoshiaki Yamamoto, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 297 days.

(21) Appl. No.: 12/899,983

(22) Filed: Oct. 7, 2010

(65) Prior Publication Data

US 2011/0024406 A1 Feb. 3, 2011

Related U.S. Application Data

(62) Division of application No. 10/582,013, filed as application No. PCT/JP2005/006207 on Mar. 24, 2005, now Pat. No. 7,812,283.

(30) Foreign Application Priority Data

Mar. 26, 2004 (JP) ................. 2004-092933

(51) Int. Cl.
*B23K 26/06* (2014.01)
*H01L 21/84* (2006.01)
(Continued)

(52) U.S. Cl.
CPC ......... *B23K 26/0656* (2013.01); *B23K 26/0738* (2013.01); *H01L 27/1285* (2013.01)

(58) Field of Classification Search
CPC ........... B23K 26/0656; B23K 26/0738; B23K 26/06; B23K 26/0648; B23K 26/0639; B23K 26/0665; H01L 27/1285; H01L 21/02422; H01L 21/02488; H01L 21/02532; H01L 21/02672; H01L 21/02678; H01L 21/02686; H01L 21/02691; H01L 21/268
USPC ............... 219/124.1, 121.73, 121.74, 121.75, 219/121.67, 121.69, 121.68, 121.77, 219/121.82, 121.83, 121.78, 121.79; 438/166, 487, 795, 151, 149, 308, 689, 438/668, 819
See application file for complete search history.

(56) References Cited

U.S. PATENT DOCUMENTS 4,262,208 A 4/1981 Suzki et al.
4,420,233 A 12/1983 Nomoto et al.
(Continued)

FOREIGN PATENT DOCUMENTS

EP 0905540 A 3/1999
EP 1055479 A 11/2000
(Continued)

OTHER PUBLICATIONS

International Search Report for PCT/JP2005/006207 dated Jul. 5, 2005.
(Continued)

*Primary Examiner* — Hung D Nguyen
(74) *Attorney, Agent, or Firm* — Eric J. Robinson; Robinson Intellectual Property Law Office, P.C.

(57) ABSTRACT

An object of the present invention is to provide a laser irradiation method and a laser irradiation apparatus for irradiating an irradiation surface with a linear beam having more homogeneous intensity by blocking a low-intensity part of the linear beam without forming the fringes due to the diffraction on the irradiation surface. In the laser irradiation, a laser beam emitted from a laser oscillator 101 passes through a slit 102 so as to block a low-intensity part of the laser beam, the traveling direction of the laser beam is bent by a mirror 103, and an image formed at the slit is projected to an irradiation surface 106 by a convex cylindrical lens 104.

5 Claims, 9 Drawing Sheets

(51) Int. Cl.
*B23K 26/073* (2006.01)
*H01L 27/12* (2006.01)

(56) References Cited

U.S. PATENT DOCUMENTS

| | | | |
|---|---|---|---|
| RE32,598 E * | 2/1988 | White | 356/318 |
| 4,734,550 A | 3/1988 | Imamura et al. | |
| 4,743,932 A | 5/1988 | Matsui | |
| 4,800,276 A | 1/1989 | Noguchi | |
| 4,851,978 A | 7/1989 | Ichihara | |
| 4,861,964 A | 8/1989 | Sinohara | |
| 4,865,686 A | 9/1989 | Sinohara | |
| 4,879,451 A | 11/1989 | Gart | |
| 4,941,093 A | 7/1990 | Marshall et al. | |
| 4,942,588 A | 7/1990 | Yasui et al. | |
| 4,990,763 A | 2/1991 | Shinada | |
| 5,005,969 A | 4/1991 | Kataoka | |
| 5,010,230 A | 4/1991 | Uemura | |
| 5,059,013 A | 10/1991 | Jain | |
| 5,095,386 A * | 3/1992 | Scheibengraber | 359/668 |
| RE33,947 E | 6/1992 | Shinohara | |
| 5,134,426 A | 7/1992 | Kataoka et al. | |
| 5,145,808 A | 9/1992 | Sameshima et al. | |
| 5,237,149 A | 8/1993 | Macken | |
| 5,307,184 A | 4/1994 | Nishiwaki et al. | |
| 5,608,492 A | 3/1997 | Sato | |
| 5,643,801 A | 7/1997 | Ishihara et al. | |
| 5,721,416 A | 2/1998 | Burghardt et al. | |
| 5,728,215 A | 3/1998 | Itagaki et al. | |
| 5,756,364 A | 5/1998 | Tanaka et al. | |
| 5,760,366 A | 6/1998 | Haruta et al. | |
| 5,815,494 A | 9/1998 | Yamazaki et al. | |
| 5,864,430 A | 1/1999 | Dickey et al. | |
| 5,907,770 A * | 5/1999 | Yamazaki et al. | 438/149 |
| 5,932,118 A | 8/1999 | Yamamoto et al. | |
| 6,002,523 A | 12/1999 | Tanaka | |
| 6,008,101 A | 12/1999 | Tanaka et al. | |
| 6,008,144 A | 12/1999 | Shih et al. | |
| 6,100,961 A | 8/2000 | Shiraishi et al. | |
| 6,168,968 B1 | 1/2001 | Umemoto et al. | |
| 6,172,820 B1 | 1/2001 | Kuwahara | |
| 6,187,088 B1 | 2/2001 | Okumura | |
| 6,246,524 B1 | 6/2001 | Tanaka | |
| 6,259,512 B1 | 7/2001 | Mizouchi | |
| 6,261,856 B1 * | 7/2001 | Shinohara et al. | 438/30 |
| 6,310,727 B1 | 10/2001 | Tanaka | |
| 6,322,220 B1 | 11/2001 | Sano et al. | |
| 6,323,937 B1 | 11/2001 | Sano | |
| 6,353,218 B1 | 3/2002 | Yamazaki et al. | |
| 6,388,386 B1 | 5/2002 | Kunii et al. | |
| 6,393,042 B1 | 5/2002 | Tanaka | |
| 6,429,100 B2 | 8/2002 | Yoneda | |
| 6,437,313 B2 | 8/2002 | Yamazaki et al. | |
| 6,472,295 B1 * | 10/2002 | Morris et al. | 438/463 |
| 6,495,405 B2 | 12/2002 | Voutsas et al. | |
| 6,512,634 B2 | 1/2003 | Takana | |
| 6,524,977 B1 | 2/2003 | Yamazaki et al. | |
| 6,528,397 B1 | 3/2003 | Taketomi et al. | |
| 6,563,567 B1 | 5/2003 | Komatsuda et al. | |
| 6,573,163 B2 | 6/2003 | Voutsas et al. | |
| 6,635,850 B2 | 10/2003 | Amako et al. | |
| 6,642,091 B1 | 11/2003 | Tanabe | |
| 6,664,147 B2 | 12/2003 | Voutsas | |
| 6,676,878 B2 | 1/2004 | O'Brien et al. | |
| 6,686,978 B2 | 2/2004 | Voutsas | |
| 6,750,423 B2 | 6/2004 | Tanaka et al. | |
| 6,750,424 B2 | 6/2004 | Tanaka | |
| 6,753,212 B2 | 6/2004 | Yamazaki et al. | |
| 6,777,276 B2 | 8/2004 | Crowder et al. | |
| 6,787,755 B2 | 9/2004 | Yamazaki et al. | |
| 6,791,060 B2 | 9/2004 | Dunsky et al. | |
| 6,818,484 B2 | 11/2004 | Voutsas | |
| 6,818,568 B2 | 11/2004 | Tanaka | |
| 6,852,609 B2 | 2/2005 | Yang | |
| 6,852,947 B2 | 2/2005 | Tanaka | |
| 6,861,614 B1 | 3/2005 | Tanabe et al. | |
| 6,870,125 B2 | 3/2005 | Doi et al. | |
| 6,885,432 B2 | 4/2005 | Tsuji | |
| 6,891,175 B2 | 5/2005 | Hiura | |
| 6,908,835 B2 | 6/2005 | Sposili et al. | |
| 6,911,659 B1 | 6/2005 | Malo | |
| 6,943,086 B2 | 9/2005 | Hongo et al. | |
| 6,949,452 B2 | 9/2005 | Hatano et al. | |
| 6,961,361 B1 | 11/2005 | Tanaka | |
| 6,977,775 B2 | 12/2005 | Sasaki et al. | |
| 6,984,573 B2 | 1/2006 | Yamazaki et al. | |
| 6,989,300 B1 | 1/2006 | Tanabe | |
| 6,989,524 B2 | 1/2006 | Yamazaki et al. | |
| 7,049,184 B2 | 5/2006 | Tanabe | |
| 7,063,999 B2 | 6/2006 | Tanabe et al. | |
| 7,078,281 B2 | 7/2006 | Tanaka et al. | |
| 7,078,322 B2 | 7/2006 | Tanada et al. | |
| 7,105,048 B2 | 9/2006 | Yamazaki et al. | |
| 7,109,069 B2 | 9/2006 | Kokubo et al. | |
| 7,115,457 B2 | 10/2006 | Sasaki et al. | |
| 7,138,306 B2 | 11/2006 | Tanaka et al. | |
| 7,164,152 B2 | 1/2007 | Im | |
| 7,183,148 B2 | 2/2007 | Yazaki et al. | |
| 7,192,852 B2 | 3/2007 | Hatano et al. | |
| 7,223,644 B2 | 5/2007 | Inoue et al. | |
| 7,230,316 B2 | 6/2007 | Yamazaki et al. | |
| 7,252,910 B2 | 8/2007 | Hasegawa et al. | |
| 7,253,120 B2 | 8/2007 | Glazer et al. | |
| 7,259,081 B2 | 8/2007 | Im | |
| 7,294,589 B2 | 11/2007 | Tanaka | |
| 7,303,980 B2 | 12/2007 | Yamazaki et al. | |
| 7,326,623 B2 | 2/2008 | Hongo et al. | |
| 7,388,172 B2 | 6/2008 | Sercel et al. | |
| 7,402,772 B2 | 7/2008 | Hamada et al. | |
| 7,408,144 B2 | 8/2008 | Yamazaki et al. | |
| 7,410,508 B2 | 8/2008 | Sasaki et al. | |
| 7,452,788 B2 | 11/2008 | Yamazaki et al. | |
| 7,468,312 B2 | 12/2008 | Tanaka | |
| 7,517,773 B2 | 4/2009 | Tanada et al. | |
| 7,521,326 B2 | 4/2009 | Tanaka | |
| 7,528,023 B2 | 5/2009 | Sasaki et al. | |
| 7,541,230 B2 | 6/2009 | Sasaki et al. | |
| 7,660,042 B2 | 2/2010 | Sasaki et al. | |
| 7,666,769 B2 | 2/2010 | Hatano et al. | |
| 7,772,523 B2 | 8/2010 | Tanaka et al. | |
| 7,812,283 B2 | 10/2010 | Tanaka et al. | |
| 7,834,353 B2 | 11/2010 | Hongo et al. | |
| 7,927,935 B2 | 4/2011 | Sasaki et al. | |
| 7,927,983 B2 | 4/2011 | Tanaka et al. | |
| 7,943,885 B2 | 5/2011 | Tanaka et al. | |
| 8,026,152 B2 | 9/2011 | Yamazaki et al. | |
| 2002/0047847 A1 | 4/2002 | Tamura | |
| 2002/0102821 A1 | 8/2002 | Voutsas | |
| 2002/0134765 A1 | 9/2002 | Tanaka et al. | |
| 2002/0146873 A1 * | 10/2002 | Tanaka | 438/166 |
| 2002/0151121 A1 | 10/2002 | Tanaka | |
| 2002/0166845 A1 | 11/2002 | Cordingley et al. | |
| 2003/0042430 A1 * | 3/2003 | Tanaka et al. | 250/492.1 |
| 2003/0068836 A1 | 4/2003 | Hongo et al. | |
| 2003/0086182 A1 | 5/2003 | Tanaka et al. | |
| 2003/0103176 A1 | 6/2003 | Abe et al. | |
| 2003/0112322 A1 | 6/2003 | Tanaka | |
| 2003/0150843 A1 * | 8/2003 | Doi et al. | 219/121.6 |
| 2003/0216012 A1 | 11/2003 | Sasaki et al. | |
| 2004/0017365 A1 | 1/2004 | Hatano et al. | |
| 2004/0041158 A1 | 3/2004 | Hongo et al. | |
| 2004/0164306 A1 | 8/2004 | Hongo et al. | |
| 2004/0195222 A1 | 10/2004 | Tanaka et al. | |
| 2004/0222197 A1 | 11/2004 | Hiramatsu | |
| 2004/0240086 A1 * | 12/2004 | Oishi et al. | 359/819 |
| 2004/0266223 A1 | 12/2004 | Tanaka et al. | |
| 2005/0035104 A1 | 2/2005 | Tanaka et al. | |
| 2005/0115937 A1 | 6/2005 | Gu et al. | |
| 2005/0227504 A1 | 10/2005 | Sasaki et al. | |
| 2005/0247684 A1 | 11/2005 | Tanaka | |
| 2005/0282408 A1 | 12/2005 | Sasaki et al. | |
| 2006/0215722 A1 | 9/2006 | Tanaka et al. | |
| 2007/0000428 A1 | 1/2007 | Yamazaki et al. | |
| 2007/0001228 A1 | 1/2007 | Kokubo et al. | |

(56) References Cited

U.S. PATENT DOCUMENTS

| | | |
|---|---|---|
| 2007/0077696 A1 | 4/2007 | Tanaka et al. |
| 2007/0131962 A1 | 6/2007 | Yazaki et al. |
| 2007/0148834 A1 | 6/2007 | Tanaka et al. |
| 2007/0158315 A1 | 7/2007 | Tanaka et al. |
| 2009/0127477 A1 | 5/2009 | Tanaka |
| 2009/0173893 A1 | 7/2009 | Tanaka et al. |
| 2012/0007159 A1 | 1/2012 | Yamazaki et al. |

FOREIGN PATENT DOCUMENTS

| | | | |
|---|---|---|---|
| EP | 1724048 A | | 11/2006 |
| EP | 1724048 B | | 11/2006 |
| EP | 1736813 A | | 12/2006 |
| JP | 52-127259 A | | 10/1977 |
| JP | 61-049556 A | | 3/1986 |
| JP | 01-260812 | | 10/1989 |
| JP | 02-032317 A | | 2/1990 |
| JP | 03-226392 | | 10/1991 |
| JP | 04-307727 | | 10/1992 |
| JP | 09-129573 A | | 5/1997 |
| JP | 09-270393 | | 10/1997 |
| JP | 09-321311 | | 12/1997 |
| JP | 10-074697 A | | 3/1998 |
| JP | 10-153746 A | | 6/1998 |
| JP | 10-286683 | | 10/1998 |
| JP | 11-109280 A | | 4/1999 |
| JP | 11-354463 | | 12/1999 |
| JP | 2000-058478 | | 2/2000 |
| JP | 2000-066133 A | | 3/2000 |
| JP | 2000-091264 A | | 3/2000 |
| JP | 2000-269161 | | 9/2000 |
| JP | 2000-323428 A | | 11/2000 |
| JP | 2000-343254 A | | 12/2000 |
| JP | 2001-068430 A | | 3/2001 |
| JP | 2001-074950 | | 3/2001 |
| JP | 2001-156017 | | 6/2001 |
| JP | 2001-156017 A | * | 6/2001 |
| JP | 2003-124136 A | | 4/2003 |
| JP | 2003-142401 | | 5/2003 |
| JP | 2003-197916 A | | 7/2003 |
| JP | 2003-203876 A | | 7/2003 |
| JP | 2003-224070 A | | 8/2003 |
| JP | 2003-257885 A | | 9/2003 |
| JP | 2003-280080 | | 10/2003 |
| JP | 2003-289080 | | 10/2003 |
| JP | 2004-054168 A | | 2/2004 |
| JP | 2004-095727 A | | 3/2004 |
| JP | 2004-103628 A | | 4/2004 |
| JP | 2004-179356 A | | 6/2004 |
| JP | 2004-179474 A | | 6/2004 |
| JP | 2004-193201 A | | 7/2004 |
| JP | 2004-289140 | | 10/2004 |
| JP | 2005-099427 A | | 4/2005 |
| JP | 2005-101654 A | | 4/2005 |
| JP | 2005-311346 A | | 11/2005 |
| JP | 2005-347741 A | | 12/2005 |
| JP | 2006-093677 A | | 4/2006 |
| JP | 2006-186349 A | | 7/2006 |
| WO | WO-2005/093801 | | 10/2005 |

OTHER PUBLICATIONS

Written Opinion for PCT/JP2005/006207 dated Jul. 5, 2005.
Office Action (Application No. 200580009439.X) dated Jan. 4, 2008.
European Search Report (Application No. 05727734.5) Dated Aug. 24, 2011.
International Search Report (Application No. PCT/JP2006/309191) Dated Jul. 25, 2006.
Written Opinion (Application No. PCT/JP2006/309191) Dated Jul. 25, 2006.
US 6,414,981, 07/2002, Tanaka (withdrawn)

* cited by examiner

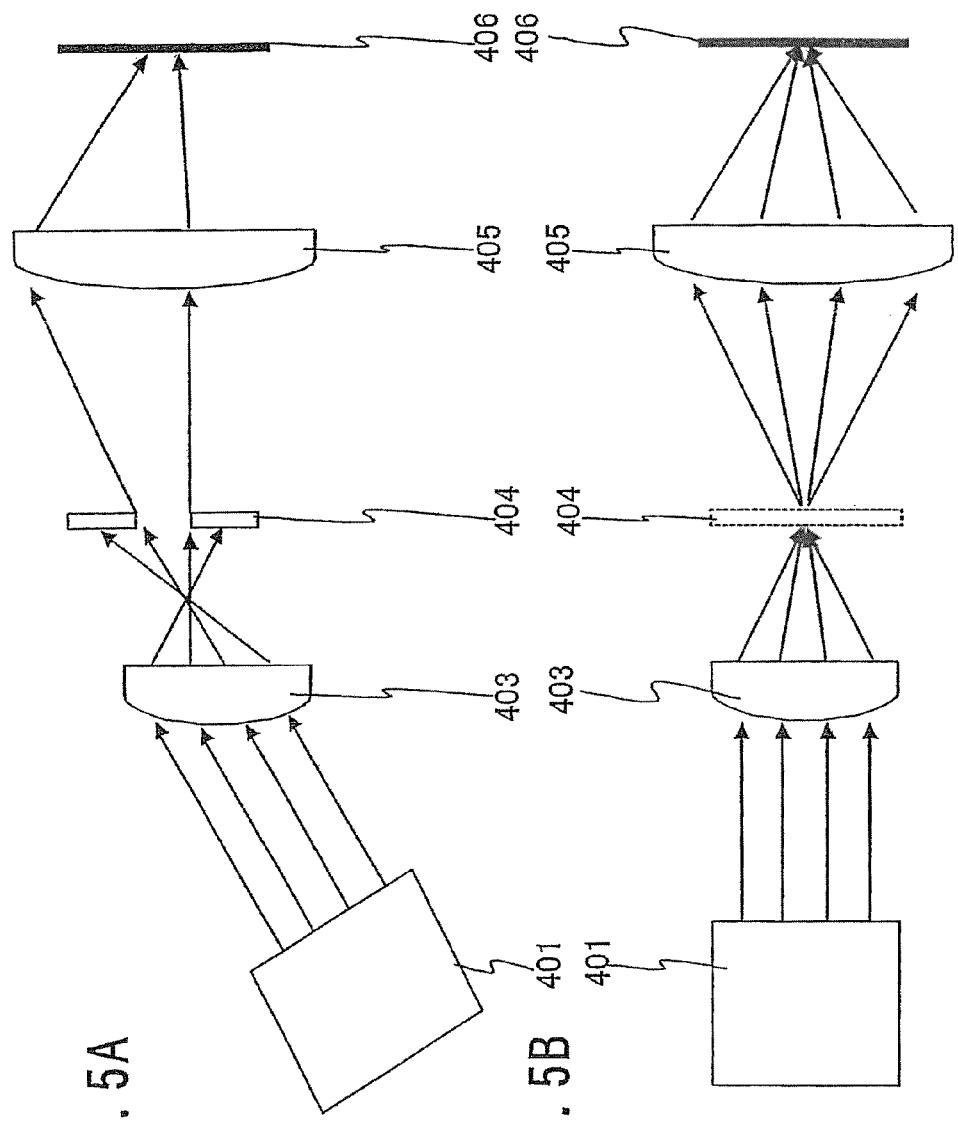

LASER IRRADIATION METHOD AND LASER IRRADIATION APPARATUS

TECHNICAL HELD

The present invention relates to a laser irradiation method and a laser irradiation apparatus which are suitable, for example, for crystallizing an amorphous semiconductor film and which can irradiate an irradiation surface with a linear beam having homogeneous intensity. More specifically, the present invention relates to a laser irradiation method and a laser irradiation apparatus which can irradiate the irradiation surface with a linear beam having homogeneous intensity by blocking a low-intensity part of the beam and suppressing the fringes due to the diffraction of the beam on the irradiation surface.

BACKGROUND ART

In recent years, a technique for manufacturing a thin film transistor (hereinafter referred to as a TFT) over a substrate has made a great progress, and application development to an active matrix display device has been advanced. In particular, a TFT formed using a poly-crystalline semiconductor film is superior in field-effect mobility (also referred to as mobility simply) to a TFT formed using a conventional amorphous semiconductor film, and therefore high-speed operation becomes possible when the TFT is formed using the poly-crystalline semiconductor film. For this reason, it has been tried to control a pixel by a driver circuit formed over the same substrate as the pixel, which was controlled conventionally by a driver circuit provided outside the substrate.

A substrate used in a semiconductor device is expected to be a glass substrate rather than a quartz substrate in terms of cost. However, the glass substrate is inferior in heat resistance and easy to change in shape due to the heat. Therefore, when the TFT using the poly-crystalline semiconductor film is formed over the glass substrate, a laser annealing method is employed to crystallize a semiconductor film formed over the glass substrate in order to prevent the glass substrate from changing in shape due to the heat.

Compared with another annealing method which uses radiation heat or conduction heat, the laser annealing has advantages that the processing time can be shortened drastically and that a semiconductor substrate or a semiconductor film over a substrate can be heated selectively and locally so that the substrate is hardly damaged thermally. It is noted that the laser annealing herein described indicates a technique to anneal a damaged layer or an amorphous layer in a semiconductor substrate or a semiconductor film and a technique to crystallize an amorphous semiconductor film formed over a substrate. Moreover, the laser annealing includes a technique applied to planarize or modify the surface of the semiconductor substrate or the semiconductor film.

As the laser oscillators used in the laser annealing, there are a pulsed laser oscillator and a continuous wave laser oscillator according to the oscillation method. In recent years, it has been known that the crystal grain formed in the semiconductor film becomes larger when using the continuous wave laser oscillator such as an Ar laser or a YVO$_4$ laser than when using the pulsed laser oscillator such as an excimer laser in crystallizing the semiconductor film. When the crystal grain in the semiconductor film becomes larger, the number of crystal grain boundaries in the channel region of the TFT formed using the semiconductor film decreases, and the carrier mobility becomes higher so that the more sophisticated device can be developed. For this reason, the continuous wave laser oscillator is attracting attention.

A laser beam having a wavelength in the visible or ultraviolet light region is often employed in the laser annealing to the semiconductor film because such a laser beam is sufficiently absorbed in the semiconductor film. However, a solid-state laser medium generally used in the CW (continuous wave) laser emits a wavelength in the range of red to near-infrared light regions, which is not sufficiently absorbed in the semiconductor film. Therefore, the laser beam emitted from the CW laser is converted into a harmonic having a wavelength in the visible light region or shorter by a non-linear optical, element. Usually, the fundamental wave in the near-infrared light region in which high power is easily obtained is often converted into a green laser beam of the second harmonic because this method has the highest conversion efficiency.

For example, when the semiconductor film is crystallized in such a way that the CW laser beam with a power of 10 W having a wavelength of 532 nm is shaped into a linear beam having a length of approximately 300 μm in a long-side direction and approximately 10 μm in a short-side direction and that the linear beam spot is scanned in the short-side direction of the linear beam, the width of a region where the large crystal grain is obtained by one scanning of the linear beam spot is approximately 200 μm. The region where the large crystal grain is obtained is hereinafter referred to as a large crystal grain region. For this reason, to crystallize the whole surface of a semiconductor film formed over a comparatively large substrate by the CW laser beam, it is necessary to perform laser annealing by moving the position of the linear beam spot in its long-side direction by the width of the large crystal grain region obtained by one scanning of the linear beam spot.

On the other hand, at the same time as the formation of the large crystal grain region, a crystal region, which is not the large crystal grain region, (hereinafter referred to as an inferior crystallinity region) is formed at opposite ends of the linear beam in the long-side direction where the energy is attenuated. The inferior crystallinity region has a concavoconvex surface and is not suitable for manufacturing TFT thereover. When a TFT is formed using the inferior crystallinity region, the variation of electrical characteristic and operation error occur. Consequently, in order to manufacture a TFT having high reliability, it is necessary to determine correctly the region where the TFT is manufactured so that the TFT is not manufactured in the inferior crystallinity region. However, even after taking such a measure, the inferior crystallinity region still expands as the linear beam is made longer in the long-side direction.

As a result, the region where the TFT can be formed relative to the whole substrate decreases, and it is difficult to manufacture a semiconductor device with high degree of integration. The above problem is considered to result from Gaussian intensity distribution of the laser beam to be used. The Gaussian distribution has highest intensity in the center of the beam spot and lower intensity toward the opposite ends of the beam spot. Therefore, when the linear beam is made longer in the long-side direction, its end portions are extended accordingly, which results in the expansion of the inferior crystallinity region.

To reduce the inferior crystallinity region, the Gaussian intensity distribution may be changed into a top-flat shape. A laser manufacturer has introduced in its catalog a method for forming the top-flat shape with the use of a diffractive optical element or an optical waveguide. By forming the top-flat shape, the intensity distribution can have steep edges, and thus the inferior crystallinity region formed after the laser annealing can be reduced drastically. Moreover, with the top-flat intensity distribution, the inferior crystallinity region does not increase even when the linear beam is made longer in the long-side direction.

As mentioned above, the top-flat intensity distribution has the advantages. However, among the introduced methods for forming the top-flat shape, the diffractive optical element has some disadvantages of its high cost and technical difficulty because it requires fine processing on the order of nanometer to obtain the good characteristic. Moreover, the optical waveguide has a disadvantage that interference fringes appear on the irradiation surface due to the high and low intensity of the laser beam because the laser beam with a wavelength of 532 nm has high coherency.

Thus, the method for forming the top-flat shape which can avoid the problem due to the Gaussian distribution has several disadvantages. Consequently, the present inventors has developed another method for avoiding the problem due to the Gaussian intensity distribution.

DISCLOSURE OF INVENTION

The present inventors have succeeded in developing a laser annealing method for reducing the inferior crystallinity region by blocking the end portions of the Gaussian distribution having low energy density without generating the fringes due to the diffraction on the irradiation surface. An object of the present invention is to provide a laser annealing method and a laser annealing apparatus which are suitable, for example, for crystallizing the amorphous semiconductor film and which can irradiate the irradiation surface with the linear beam having homogeneous intensity by blocking the end portions of the linear beam having low energy density without generating the fringes due to the diffraction on the irradiation surface.

Another object of the present invention is to provide a method and an apparatus for manufacturing a TFT using the crystalline semiconductor film in a simplified way. Briefly speaking, the object of the present invention is to eliminate the inferior crystallinity region in the laser annealing by a simple technique without forming any fringes due to the diffraction.

In relation with the object of the present invention, a diffraction phenomenon which causes the fringes is described first. A Fraunhofer diffraction image formed when the plane wave is incident into a slit is considered. A displacement of the beam at the slit surface is expressed as the function of the coordinates of $\xi$ and $\eta$ at the slit with the equation A1 where L is a distance between the slit and the image, k is the wavenumber, $\lambda$ is the wavelength, and w is the width of the slit. In the formed image, the complex amplitude u is expressed as the function of x with the equation A2, and the light intensity I is expressed with the equation A3. In these equations, x=0 in the center of the slit. Moreover, X, which is the inverse number of the length, is expressed with the equation A4.

$$u(\xi, \eta) = \begin{cases} 1 & \xi \le \left|\frac{w}{2}\right| \\ 0 & \text{other} \end{cases}$$ [Equation A1]

$$u(x) = \int_{-w/2}^{w/2} \exp\left(\frac{ikx\xi}{L}\right)d\xi = \frac{w\sin(wX)}{wX}$$ [Equation A2]

-continued $$I(x) = |u_1(x)|^2 = \frac{w^2[1 - \cos(2wX)]}{2(wX)^2}$$ [Equation A3]

$$X \equiv \frac{kx}{2L} = \frac{\pi x}{\lambda L}$$ [Equation A4]

According to these functions, the maximum value of the intensity distribution is 1 when X=0, and a major part of the laser beam concentrates on the center. The peak at the center is referred to as the zeroth diffraction beam, which corresponds to the light traveling straightforward along the optical axis from the slit. The diffraction beams are respectively referred to as ±first order diffraction beams, ±second order diffraction beams - - - from the center toward the edge. The maximal value of the intensity of ±mth diffraction beams (m≠0) is approximated from the equation A5, which is converted into the equation Az.

$$\pi w x/\lambda L \approx (m-1)\pi + \pi/2$$ [Equation A5]

$$x \approx \left(m - \frac{1}{2}\right)\frac{\lambda L}{w}$$ [Equation Az]

The present invention is to provide a laser irradiation method and a laser irradiation apparatus which are suitable, for example, for crystallizing the amorphous semiconductor film and which can irradiate the irradiation object with the linear beam having homogeneous intensity by blocking the part of the laser beam having the low energy density without generating the fringe due to the diffraction on the irradiation object. The present invention discloses two laser irradiation methods. In the first laser irradiation method, a part of the laser beam emitted from the laser oscillator having the low energy density is blocked by using the slit, and an image formed at the slit is projected to the irradiation surface by a convex cylindrical lens.

The slit, the convex cylindrical lens, and the irradiation surface are preferably arranged so that the distance (M1) between the slit and the convex cylindrical lens and the distance (M2) between the convex cylindrical lens and the irradiation surface satisfy the following two equations 1 and 2:

$$M1 = f(s+D)/D$$ [Equation 1]

$$M2 = f(s+D)/s$$ [Equation 2]

where s is the width of the slit, D is the length of the linear beam in the long-side direction, and f is the focal length of the convex cylindrical lens. Thus, the image at the slit is projected to the irradiation surface by the convex cylindrical lens. Since the image at the slit corresponds to the case of L=0 in the equation A4, the fringes due to the diffraction are not formed in this position. Therefore, the fringes do not appear on the irradiation surface where the image at the slit is projected.

In the second laser irradiation method, the laser beam emitted from the laser oscillator is reflected by a mirror and the reflected laser beam is incident into a first convex spherical lens obliquely by the predetermined angle so as to form a linear beam due to the astigmatism. After that, the linear beam passes through the slit so that its opposite ends having low intensity are blocked. Next, the linear beam with its opposite ends blocked is delivered to the irradiation surface by a second convex spherical lens. It is preferable that the slit and the second convex spherical lens are arranged so that the distance (M1) between the slit and the second convex spherical lens and the distance (M2) between the second convex spherical lens and the irradiation surface satisfy the above equations 1 and 2. In this case, f is the focal length of the second convex spherical lens.

In addition, the present invention discloses two laser irradiation apparatus. The first laser irradiation apparatus comprises a laser oscillator, a slit for blocking a low-intensity part of a laser beam emitted from the laser oscillator, and a convex cylindrical lens for projecting an image formed at the slit to the irradiation surface. It is preferable to arrange the slit, the convex cylindrical lens, and the irradiation surface so that the distance (M1) between the slit and the convex cylindrical lens and the distance (M2) between the convex cylindrical lens and the irradiation surface satisfy the equations 1 and 2.

The second laser irradiation apparatus comprises a laser oscillator, a mirror tilted by the predetermined angle for guiding a laser beam emitted from the laser oscillator to a first convex spherical lens, the first convex spherical lens through which the laser beam reflected on the mirror passes so as to form a linear beam due to the astigmatism, a slit for blocking a low-intensity part of the laser beam, and a second convex spherical lens for projecting an image of the linear beam on the irradiation surface. It is preferable to arrange the slit, the second convex spherical lens, and the irradiation surface so that the distance (M1) between the slit and the second convex spherical lens and the distance (M2) between the second convex spherical lens and the irradiation surface satisfy the equations 1 and 2.

According to the present invention, a low-intensity part of the laser beam is blocked by the slit, and the image formed at the slit is projected to the irradiation surface by the lens. Thus, the interference fringes due to the light diffraction at the slit can be suppressed on the irradiation surface. Therefore, the laser annealing can be performed homogeneously to crystallize the amorphous semiconductor film by irradiating with the linear beam having homogeneous intensity which forms no fringes due to the diffraction on the irradiation surface. Moreover, it is possible to manufacture a semiconductor device such as a TFT having homogeneous crystallinity easily according to the present invention.

BRIEF DESCRIPTION OF DRAWINGS

In the accompanying drawings:

FIG. 5A is a top view of the second laser annealing method and apparatus for describing the embodiment 3 of the present invention; FIG. 5B is a side view of the second laser annealing method and apparatus for describing the embodiment 3 of the present invention;

BEST MODE FOR CARRYING OUT THE INVENTION

Figure 1:
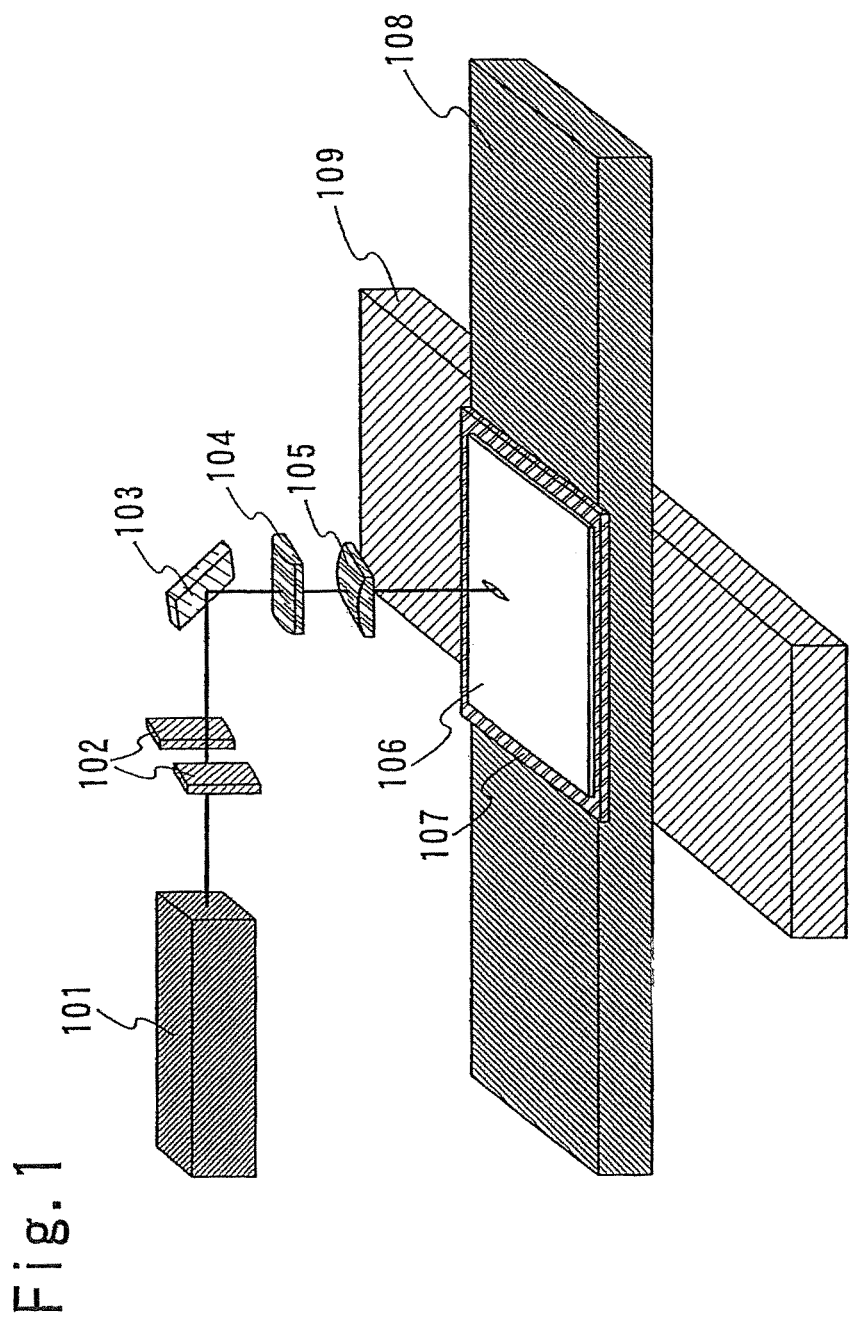
FIG. 1 is a perspective view of the laser annealing method and apparatus for describing the embodiment mode and the embodiment 1 of the present invention.

An embodiment mode and embodiments of the present invention are hereinafter described based on drawings. However, the present invention is not limited to the description of the embodiment mode and the embodiments but specified by the scope of claims. The present invention comprises the above-mentioned features such as the slit for blocking a low-intensity part of a laser beam and the lens for projecting the laser beam to the irradiation surface. Moreover, as described above, the present invention discloses the first laser annealing method using a convex cylindrical lens and the second laser annealing method using a convex spherical lens. The first laser annealing method is described in two modes in which the laser beam is incident vertically into the irradiation surface as shown in an embodiment 1 with reference to FIGS. 1 to 2B and in which the laser beam is incident obliquely into the irradiation surface as shown in an embodiment 2 with reference to FIG. 3.

The position of the slit is determined in consideration of the focal length of the lens used as projection means, the width of the slit, and the projection magnification. Since the position of the slit corresponds to L=0 in the equation Az, the high order diffraction beams can be minimized on the irradiation surface when the image formed at the slit can be projected perfectly to the irradiation surface by the lens. Accordingly, the large crystal grain region can be manufactured without forming any fringes due to the diffraction on the irradiation surface by simply arranging the slit, the lens, and the irradiation surface appropriately. In other words, the laser irradiation can be performed homogeneously without forming the fringes due to the diffraction which causes the inhomogeneous intensity of the linear beam.

The laser oscillator used in the present invention is not limited in particular, and it may be a pulsed laser oscillator or a CW laser oscillator. As the pulsed laser oscillator, an excimer laser, a YAG laser, a $YVO_4$ laser, or the like is given. As the CW laser oscillator, an Ar laser, a $YVO_4$ laser, a YAG laser, or the like is given. In the present invention, the laser beam may be delivered straightforward from the laser oscillator to the slit. It is preferable to deliver the laser beam to the slit by bending the traveling direction of the laser beam with the use of the mirror provided between the laser oscillator and the slit for the accurate optical alignment.

When the laser irradiation is performed using the CW laser oscillator, the crystal grain formed in a semiconductor film grows larger. Therefore, when the TFT is formed with the semiconductor film, the number of crystal grain boundaries in the channel region in the TFT decreases. Accordingly, the carrier mobility increases and the more sophisticated device can be developed. In particular, a solid-state laser is more preferable because of its stable output. The solid-state laser medium used in the CW laser oscillator generally emits a wavelength in the range of red to near-infrared light regions, which is not sufficiently absorbed in the semiconductor film. Therefore, the laser beam emitted from the CW laser is converted into a harmonic having a wavelength in the visible light region or shorter by a non-linear optical element. Usually, the fundamental wave in the near-infrared light region in which high power is easily obtained is converted into a green laser beam of a second harmonic because the conversion efficiency is the highest.

The slit used in the present invention is not limited in particular. The slit may have any structure and any shape when it can block the low-intensity part of the laser beam. As the example, a reflector, an absorber, a prism, or the like is given. Among them, the reflector is preferable in terms of its endurance. The convex cylindrical lens is not limited in particular and may have any structure and any shape when it can form the long beam extending long in one direction. The convex cylindrical lens may be planoconvex or biconvex. In the case of the planoconvex cylindrical lens, it is preferable that the cylindrical lens has a convex surface on the side where the laser beam is incident in point of low aberration and high accuracy.

The second laser annealing method and apparatus of the present invention don't use the convex cylindrical lens, which is used in the first laser annealing method and apparatus, but uses a convex spherical lens. In this case, the convex spherical lens is not limited in particular, and it may have any structure and any shape when it can project the linear laser beam to the irradiation surface. The convex spherical lens may have a convex surface in one or both of the sides where the laser beam is incident and emitted. The second laser irradiation method and apparatus will be described in the embodiment 3 with reference to FIGS. 4 to 5B.

Next, the embodiment mode of the present invention is described with reference to FIG. 1. In FIG. 1, a laser beam is emitted from a laser oscillator 101. The laser oscillator 101 may be a CW laser oscillator or a mode-locked pulsed laser oscillator having the repetition rate of 10 MHz or more. Then, a low-intensity part of the laser beam emitted from the laser oscillator 101 is blocked by a slit 102. After that, the laser beam is bent by a mirror 103 so that the laser beam travels toward a semiconductor film 106. The bent laser beam is extended by a convex cylindrical lens (hereinafter referred to as a cylindrical lens simply when any particular description is not made) 104 acting on only one direction.

Next, the laser beam is converged in one direction by a cylindrical lens 105 which is rotated by 90° from the cylindrical lens 104. Then, the laser beam is delivered to the semiconductor film 106. The cylindrical lens 104 acts on the long-side direction of the linear beam on the irradiation surface, and the cylindrical lens 105 acts on the short-side direction of the linear beam on the irradiation surface. In other words, the cylindrical lens 104 changes only the length of the linear beam in the long-side direction, and the cylindrical lens 105 changes only the length thereof in the short-side direction.

Figure 2:
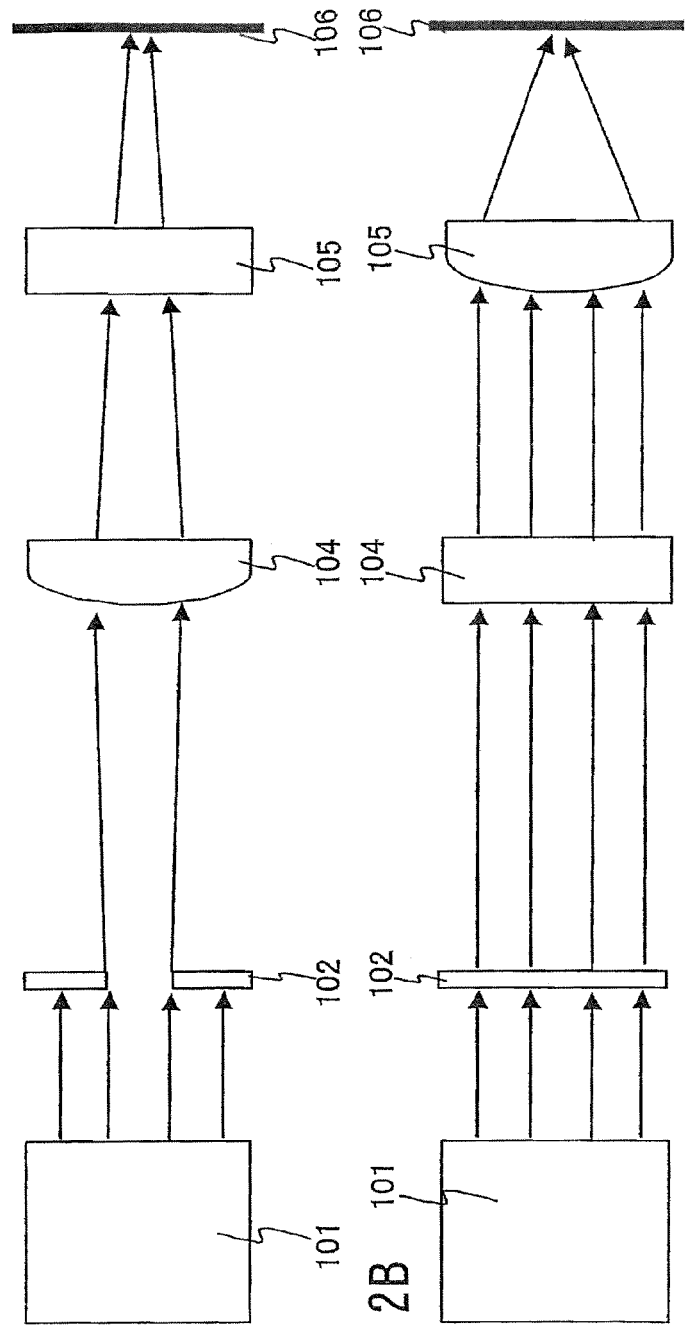
FIG. 2A is a top view of the laser annealing method and apparatus for describing the embodiment mode and the embodiment 1 of the present invention.
FIG. 2B is a side view of the laser annealing method and apparatus for describing the embodiment mode and the embodiment 1 of the present invention.
Figure 3:
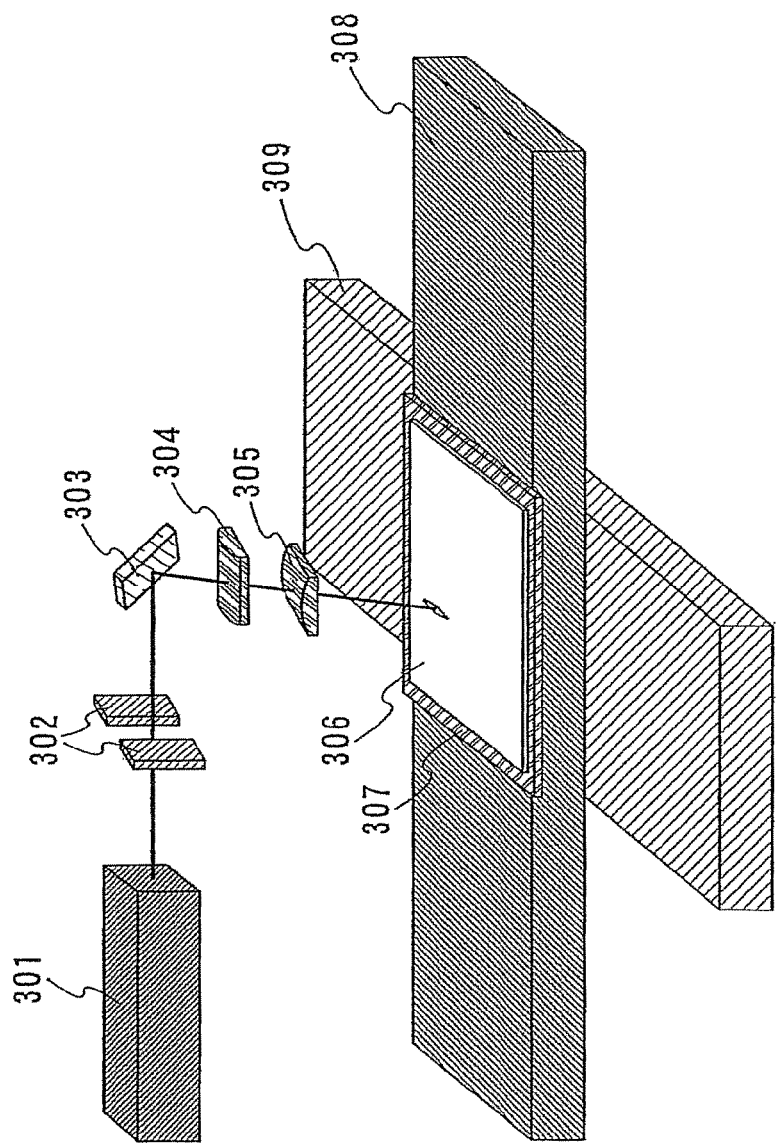
FIG. 3 is a perspective view of the laser annealing method and apparatus for describing the embodiment 2.

This is described in more detail with reference to FIGS. 2A and 2B. The same reference numerals are given to the same parts in FIGS. 1 to 2B. FIG. 2A is a top view of FIG. 1 and shows an optical path of the linear beam in the long-side direction. FIG. 2B is a side view of FIG. 1 and shows the optical path in the short-side direction. In FIG. 2A, the laser beam is emitted from the laser oscillator 101, and a low-intensity part of the laser beam is blocked by a slit 102 so that only a high-intensity part of the laser beam is emitted from the slit 102. Then, an image formed at the slit 102 is projected to the semiconductor film 106 by the cylindrical lens 104.

The positional relations among the cylindrical lens 104, the slit 102, and the semiconductor film 106 as irradiation surface are described in detail with the use of the equations. In the equations, f is the focal length of the cylindrical lens 104, s is the width of the slit 102, M1 is the distance between the slit 102 and the cylindrical lens 104, M2 is the distance between the cylindrical lens 104 and the semiconductor film 106, and D is the length of the linear beam in the long-side direction on the semiconductor film 106, which is the irradiation object.

The positional relations are given by the following two equations:

$$s/D = M1/M2 \quad \text{[Equation a]}$$

$$1/f = 1/M1 + 1/M2 \quad \text{[Equation b]}$$

Based on these equations, other two following equations can be given by:

$$M1 = f(s+D)/D \quad \text{[Equation 1]}$$

$$M2 = f(s+D)/s \quad \text{[Equation 2]}$$

Therefore, the fringes due to the diffraction are not translated to the semiconductor film by arranging the slit, the cylindrical lens, and the irradiation surface based on the above equations. Accordingly, the laser irradiation which hardly forms the inferior crystallinity region can be achieved. Further, instead of the cylindrical lens, a spherical lens having the same focal length f may be used. In this case, since the spherical lens also acts on the short-side direction of the linear bean, it is necessary to add a lens for compensation.

Figure 4:
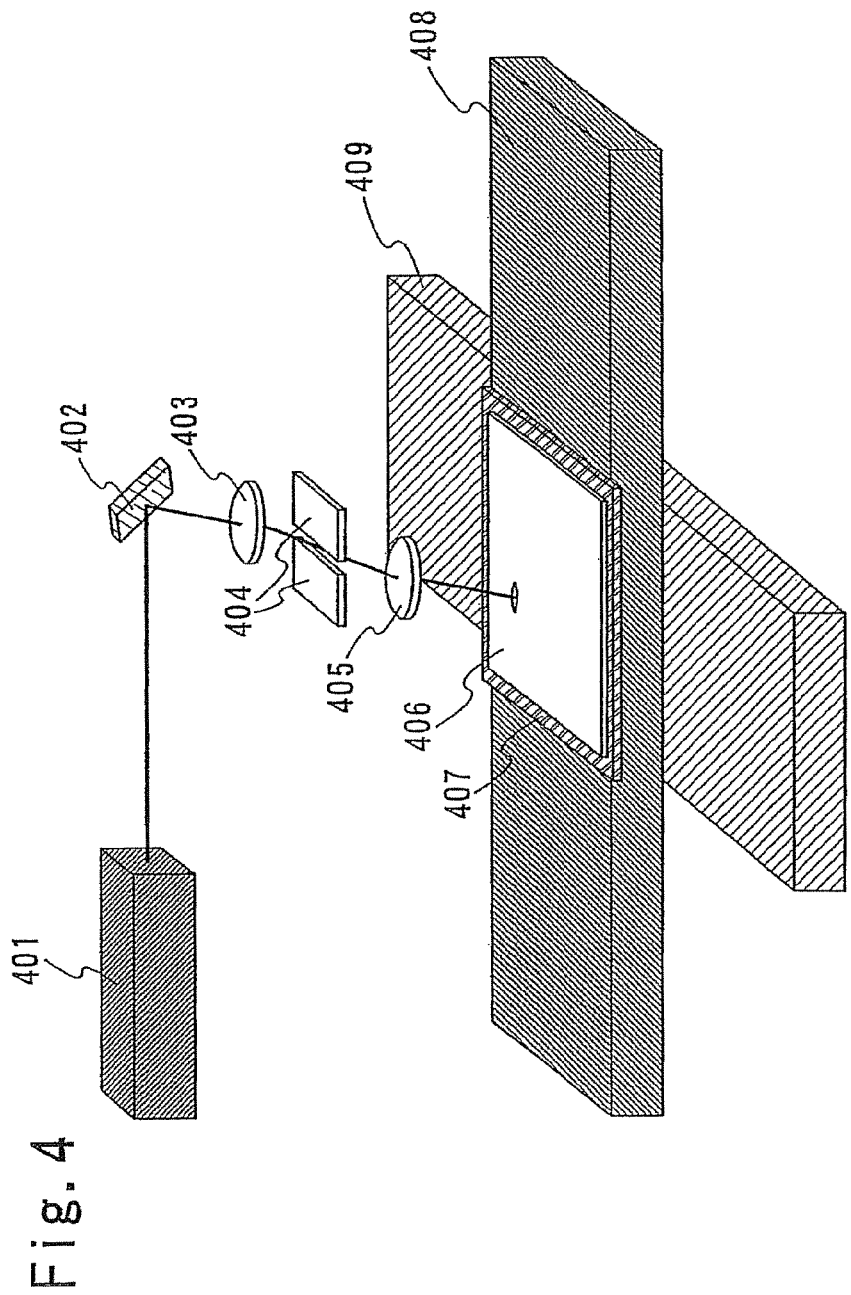
FIG. 4 is a perspective view of the second laser annealing method and apparatus for describing the embodiment mode and the embodiment 3 of the present invention.

Moreover, the above equations are applicable to the second laser annealing method of the present invention as shown in FIGS. 4 to 5B in which the convex spherical lens is used instead of the cylindrical lens. Specifically, the positional relations among a slit 404, a second convex spherical lens 405, and a semiconductor film 406 can be expressed by the same equations as those mentioned above, which will be described in the embodiment 3. In other words, the equations 1 and 2 express the distance (M1) between the slit 404 and the second convex spherical lens 405 and the distance (M2) between the second convex spherical lens 405 and the semiconductor film 406.

Subsequently, the laser annealing by the present invention is described with reference to FIG. 1. A glass substrate 107 with a semiconductor film 106, which is the irradiation object, formed thereover is provided to an X-stage 108 and a Y-stage 109 which can move at a speed from 100 to 1000 mm/s. A large crystal grain region can be formed over the whole surface of the substrate by moving the irradiation object at the appropriate speed while irradiating with the laser beam emitted from the laser oscillator 101. The optimum scanning speed is approximately 400 mm/s according to the experience of the present inventors. The semiconductor film including the large crystal grain formed thus can be used to manufacture TFT according to the known method. With this TFT, a high-speed device can be manufactured.

Embodiment 1

The present invention is hereinafter described in more detail with several embodiments. However, it is obvious that the present invention is not limited to these embodiments but specified by the scope of claims.

Embodiment of Vertical Incidence with the Use of a Mode-Locked Pulsed Laser and Two Cylindrical Lenses Referring to FIG. 1 again, the embodiment 1 describes an example of the first laser annealing method and apparatus in which the laser beam with the low-intensity part blocked is made incident vertically into the irradiation surface. In this embodiment, the laser oscillator 101 is a mode-locked pulsed laser oscillator providing 10 W at 532 nm with the repetition rate of 80 MHz and having the pulse width of 10 ps, the spatial profile of $TEM_{00}$, and the beam diameter of 2.25 mm.

A low-intensity part of the laser beam emitted from the laser oscillator 101 is blocked by the slit 102, and then the laser beam is reflected on the mirror 103 so that its traveling direction changes to be perpendicular to the semiconductor film 106 formed over the glass substrate 107. As the semiconductor film 106, an a-Si film is formed in 660 Å over the 0.7-mm-thick glass substrate 107 by a CVD apparatus. Then, the a-Si film is annealed in the furnace under nitrogenous atmosphere of 500° C. for one hour in order to increase the resistance of the a-Si film against the laser beam. The slit 102 has a width of 0.8 mm.

The image formed at the slit 102 is projected to the irradiation object by the cylindrical lens 104 by irradiating the semiconductor film 106, which is the irradiation surface, vertically with the bent laser beam. Moreover, the laser beam is converged in one direction by the cylindrical lens 105 that is rotated by 90° from the cylindrical lens 104, and then the laser beam is delivered to the semiconductor film 106. In other words, the cylindrical lens 104 acts only on the long-side direction of the linear beam, and the cylindrical lens 105 acts only on the short-side direction of the linear beam. The linear beam formed on the semiconductor film 106 has a length of 0.2 mm in the long-side direction, and the cylindrical lens 104 has a focal length of 150 mm, and the cylindrical lens 105 has a focal length of 20 mm.

Since the embodiment 1 uses an ultrashort pulse laser beam, which does not cause the interference between the incident light and the reflected light from the rear surface of the substrate, it is possible to prevent the crystallinity from varying in the semiconductor film 106. When the incident light and the reflected light interfere in the semiconductor film 106, the high and low intensity of the laser beam appears as the fringes on the semiconductor film 106 resulting in that the crystallinity of the annealed semiconductor film 106 varies. This is hereinafter described in more detail.

As mentioned above, the laser beam in this embodiment 1 has a pulse width of 10 ps, and the laser beam travels approximately 3 mm for one pulse. In this embodiment, since the glass substrate 107 has a thickness of 0.7 mm, the distance to back and forth between the rear surface and the top surface of the glass substrate 107 is 1.4 mm. Therefore, the time for which the incident laser beam and the reflected laser beam from the rear surface of the glass substrate 107 exist simultaneously in the semiconductor film 106 is approximately a half of the pulse width. For this reason, the laser annealing can be performed homogeneously without being affected by the interference of the light that much in this embodiment 1.

In the present invention, since the positional relations among the cylindrical lens 104, the slit 102, and the semiconductor film 106, which is the irradiation surface, preferably satisfy the equations (1) and (2), the lens 104, the slit 102, and the semiconductor film 106 are arranged as follows in this embodiment 1. As mentioned above, the cylindrical lens 104 has a focal length of 150 mm, the slit 102 has a width of 0.8 mm, and the linear beam formed on the semiconductor film 106 has a length of 0.2 mm in the long-side direction. Based on these numerals, the distance (M1) between the slit 102 and the cylindrical lens 104, and the distance (M2) between the slit 102 and the cylindrical lens 104 are calculated from the equations 1 and 2.

The result is as follows.

$$M1 = f(S+D)/D = 150 \times (0.8+0.2)/0.2 = 750 \text{ mm}$$

$$M2 = f(S+D)/s = 150 \times (0.8+0.2)/0.8 = 187.5 \text{ mm}$$

Therefore, the slit 102, the cylindrical lens 104, and the irradiation surface 106 are arranged so as to satisfy these relations. When the semiconductor film is irradiated with the mode-locked laser after arranging the optical elements as above, the laser irradiation is performed homogeneously because the fringes due to the diffraction are not translated to the semiconductor film, and a 0.2-mm-wide large crystal grain region is formed homogeneously without forming the inferior crystallinity region. Accordingly, the laser irradiation which hardly forms the inferior crystallinity region is achieved in this embodiment 1.

Moreover, in this embodiment, the large crystal grain region can be formed over the whole surface of the substrate by mounting the glass substrate 107 with the semiconductor film 106 formed over the X-stage 108 and the Y-stage 109 and by scanning it at a speed of 400 mm/s. The semiconductor film in which the large crystal grain is formed thus can be used to manufacture a TFT by a known method. With this TFT, a high-speed device can be manufactured.

Embodiment 2

Embodiment of Oblique Incidence with the Use of a CW Laser and Two Cylindrical Lenses This embodiment 2 describes another example of the first laser annealing method and apparatus of the present invention. Although the embodiment 2 employs the two cylindrical lenses as the embodiment 1, the laser oscillator to be used is different. The embodiment 2 uses a CW laser. In this embodiment 2, the laser beam is incident into the irradiation surface obliquely after blocking a low-intensity part of the laser beam. The embodiment 2 uses FIG. 3 in the description.

In this embodiment, a laser oscillator 301 is a CW laser oscillator providing 10 W at 532 nm and having a beam diameter of 225 mm and a spatial profile of $TEM_{00}$. A laser beam emitted from the laser oscillator 301 passes through a slit 302 so that a low-intensity part of the laser beam is blocked, and then the laser beam is bent by a mirror 303 in a direction which is oblique to the semiconductor film 306 formed over the glass substrate 107. The semiconductor film 306 is an a-Si film formed in 660 Å thick over the glass substrate 307 by the CVD apparatus. The furnace annealing is performed to the a-Si film under the nitrogenous atmosphere of 500° C. for one hour in order to increase the resistance of the a-Si film against the laser. It is noted that the slit 302 has a width of 0.8 mm.

The bent laser beam is delivered to the semiconductor film 306 in such a way that an image formed at the slit 302 is projected to the semiconductor film 306 by the cylindrical lens 304 acting on only one direction. Moreover, the laser beam is converged by a cylindrical lens 305 acting on only one direction perpendicular to the cylindrical lens 304 and delivered to the semiconductor film 306. The cylindrical lens 304 acts on the long-side direction of the linear beam on the irradiation surface, and the cylindrical lens 305 acts on the short-side direction of the linear beam. It is noted that the linear beam formed on the semiconductor film 106 has a length of 0.2 mm in the long-side direction, the cylindrical lens 304 has a focal length of 150 mm, and the cylindrical lens 305 has a focal length of 20 mm.

In the present invention, since the positional relations among the cylindrical lens 304, the slit 302, and the semiconductor film 306 preferably satisfy the equations (1) and (2), they are arranged as follows. The cylindrical lens 304 has a focal length of 150 mm, the slit 302 has a width of 0.8 mm, and the linear beam formed on the semiconductor film 306 has a length of 0.2 mm in the long-side direction. The distance (M1) between the slit 302 and the cylindrical lens 304 and the distance (M2) between the cylindrical lens 304 and the semiconductor film 306 are calculated from the equations (1) and (2) in the same way as the embodiment 1.

The result is as follows.

$$M1=f(S+D)/D=150\times(0.8+0.2)/0.2=750 \text{ mm}$$

$$M2=f(S+D)/s=150\times(0.8+0.2)/0.8=187.5 \text{ mm}$$

Therefore, the slit 302, the cylindrical lens 304, and the irradiation surface 306 are arranged so as to satisfy these relations. When the semiconductor film is irradiated with the CW laser after arranging the optical elements as above, the laser irradiation is performed homogeneously because the fringes due to the diffraction are not translated to the semiconductor film, and a 0.2-mm-wide large crystal grain region is formed homogeneously without forming the inferior crystallinity region. Accordingly, the laser irradiation which hardly forms the inferior crystallinity region is achieved in this embodiment 2.

Since this embodiment 2 employs a CW laser oscillator, the incident laser beam may interfere with the reflected laser beam from the rear surface of the glass substrate 307 in the semiconductor film 306. In order to prevent the interference in the semiconductor film 306, it is necessary that the laser beam is incident into the semiconductor film 306 at a predetermined angle or more so that the incident laser beam does not overlap the reflected laser beam in the semiconductor film 306. Specifically, the incidence angle of the laser beam preferably satisfies the following inequality:

$$\theta \geq \tan^{-1}\frac{l}{2d} \quad \text{[Equation 3]}$$

where l is the length of the beam spot in the direction where the laser beam is incident, θ is the incidence angle of the laser beam, and d is the thickness of the glass substrate. The incidence angle is set to 20° in this embodiment.

Although both of the embodiments 1 and 2 describe the first laser annealing method, this embodiment 2 differs from the embodiment 1 in the oblique incidence.

In this embodiment, the large crystal grain region can be formed all over the glass substrate 307 by mounting the substrate over the X-stage 308 and the Y-stage 309 and by scanning it at a speed of 400 mm/s. With the semiconductor film in which the large crystal grain is formed thus, a TFT can be manufactured by a known method. With this TFT, a high-speed device can be manufactured.

Embodiment 3

Embodiment of Oblique Incidence with the Use of a Mode-Locked Pulse Laser and Two Convex Spherical Lenses This embodiment 3 describes an example of the second laser annealing method and apparatus which use a convex spherical lens instead of the cylindrical lens with reference to FIG. 4. In this embodiment, a laser oscillator 401 is a mode-locked pulse laser oscillator providing 10 W at 532 nm and having a repetition rate of 80 MHz, a pulse width of 10 ps, a beam diameter of 2.25 mm, and a spatial profile of $TEM_{00}$. A laser beam emitted from the laser oscillator 401 is bent by a mirror 402.

The bent laser beam is incident obliquely into a first convex spherical lens 403 and is shaped into linear at the slit 404 due to the astigmatism. The linear beam spot has a length of 0.04 mm in the short-side direction and a length of 1 mm in the long-side direction. The slit 404 has a width of 0.8 mm in long-side the direction and blocks a low-intensity part of the linear beam at opposite ends. The laser beam emitted from the slit 404 is reduced in size to be ¼ on the semiconductor film 406 by a second convex spherical lens 405. Thus, the linear laser beam has a length of 10 μm in the short-side direction and 200 μm in the long-side direction on the semiconductor film 406.

An optical system of the embodiment 3 is described in more detail with reference to FIGS. 5A and 5B. The same reference numerals are given to the same parts in FIGS. 4 and 5. FIG. 5A is a top view of FIG. 4 and shows an optical path of the linear beam in the long-side direction. FIG. 5B is a side view of FIG. 4 and shows the optical path in the short-side direction. A semiconductor film 406 is an a-Si film formed in 660 Å over a 0.7-mm-thick glass substrate 407 by the CVD apparatus. Before the laser irradiation, the furnace annealing is performed to the a-Si film under the nitrogenous atmosphere of 500° C. for an hour in order to increase the resistance of the a-Si film against the laser beam.

Since this embodiment uses the ultrashort pulsed laser beam as described above, the incident laser beam does not interfere with the reflected laser beam from the rear surface of the substrate. The laser beam has a pulse width of 10 ps, and the laser beam travels approximately 3 mm for one pulse. Since the glass substrate 407 has a thickness of 0.7 mm, the distance to go back and forth between the rear surface and the top surface of the substrate 407 is 1.4 mm. Therefore, the time for which the incident laser beam and the reflected laser beam from the rear surface of the glass substrate 407 exist simultaneously in the semiconductor film 406 is an approximately half of the pulse width. Accordingly, the laser annealing can be performed while suppressing the interference of the beams.

In the second laser annealing method and apparatus of the present invention, the positional relations among the second convex spherical lens 405, the slit 404, and the semiconductor film 406 preferably satisfy the equations (1) and (2). In this embodiment, therefore, these optical elements are arranged as follows. As mentioned above, the second convex spherical lens 405 has a focal length of 40 mm, the slit 404 has a width of 0.8 mm, and the linear beam formed on the semiconductor film 406 has a length of 0.2 mm in the long-side direction. Based on these numerals, the distance (M1) between the slit 404 and the second convex spherical lens 405, and the distance (M2) between the second convex spherical lens 405 and the semiconductor film 406 are calculated from the equations (1) and (2) in the same way as the embodiments 1 and 2.

The result is as follows.

$$M1=f(S+D)/D=40\times(0.8+0.2)/0.2=200 \text{ mm}$$

$$M2=f(S+D)/s=40\times(0.8+0.2)/0.8=50 \text{ mm}$$

Therefore, the slit, the second convex spherical lens, and the irradiation surface are arranged so as to satisfy these relations in this embodiment. When the semiconductor film is irradiated with the mode-locked pulsed laser after arranging the optical elements as above, the laser irradiation is performed homogeneously because the fringes due to the diffraction are not translated to the semiconductor film, and a 0.2-mm-wide large crystal grain region is formed homogeneously without forming the inferior crystallinity region. Accordingly, the laser irradiation which hardly forms the inferior crystallinity region is achieved in this embodiment 3.

Moreover, in this embodiment, the large crystal grain region can be formed over the whole surface of the substrate by mounting the glass substrate 407 with the semiconductor film 406 formed over the X-stage 408 and the Y-stage 409 and scanning it at a speed of 400 mm/s. The semiconductor film in which the large crystal grain is formed thus can be used to manufacture a TFT by a known method. With this TFT, a high-speed device can be manufactured.

Embodiment 4

This embodiment describes an example of crystallizing a semiconductor film by a laser irradiation method shown in the embodiment modes and embodiments. In order to compare, the conventional laser irradiation method is also described.

This embodiment uses the first laser annealing method and apparatus in the same way as the embodiment 1 (refer to FIG. 1). In this embodiment, the laser beam is incident into the irradiation surface vertically after blocking a low-intensity part of the laser beam.

This embodiment employs a mode-locked pulse laser providing 10 W at 532 nm with a repetition rate of 80 MHz and having a pulse width of 10 ps, a beam diameter of 1.00 mm, and a spatial profile of $TEM_{00}$. The semiconductor film to be crystallized is an a-Si film formed in 660 Å over a 0.7-mm-thick glass substrate by the CVD apparatus. Heat treatment is performed for one hour under a nitrogenous atmosphere of 500° C. in order to increase the resistance of the a-Si film against the laser beam.

The laser irradiation apparatus in this embodiment has the same optical system as that in the embodiment 1. A laser beam emitted from the laser oscillator transmits through the slit and is delivered to the semiconductor film via the first cylindrical lens and the second cylindrical lens each of which acts on the different direction. It is noted that the first cylindrical lens acts on only the long-side direction of the linear beam on the irradiation surface, and the second cylindrical lens acts on only the short-side direction thereof. The optical elements are arranged so that the width of the slit, the distance between the slit and the first cylindrical lens, and the distance between the first cylindrical lens and the semiconductor film satisfy the equations 1 and 2 shown in the embodiment modes. In this embodiment, the slit has a width of 0.8 mm, the first cylindrical lens has a focal length of 150 mm, and the second cylindrical lens has a focal length of 20 mm. The beam spot formed on the semiconductor film has a length of 0.25 mm in the long-side direction.

Figure 8:
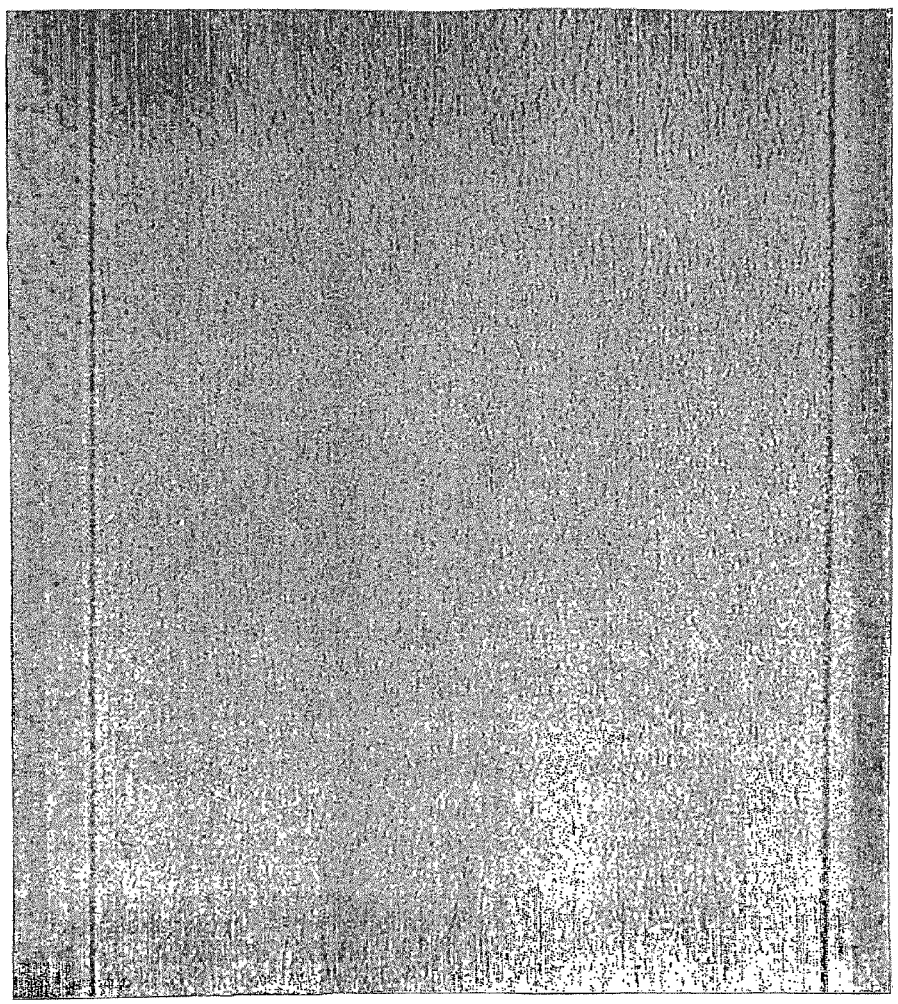
FIG. 8 is a photograph of the semiconductor film crystallized by the laser annealing method of the present invention.

The glass substrate with the semiconductor film formed thereover is mounted over the X-stage and the Y-stage and is scanned at a speed of 400 mm/s so that the semiconductor film is crystallized. FIG. 8 is a photograph of the semiconductor film crystallized thus. According to FIG. 8, the large crystal grain region is formed in the region irradiated with the laser beam. In this embodiment, the large crystal grain region having a width of 250 μm is formed.

Figure 9:
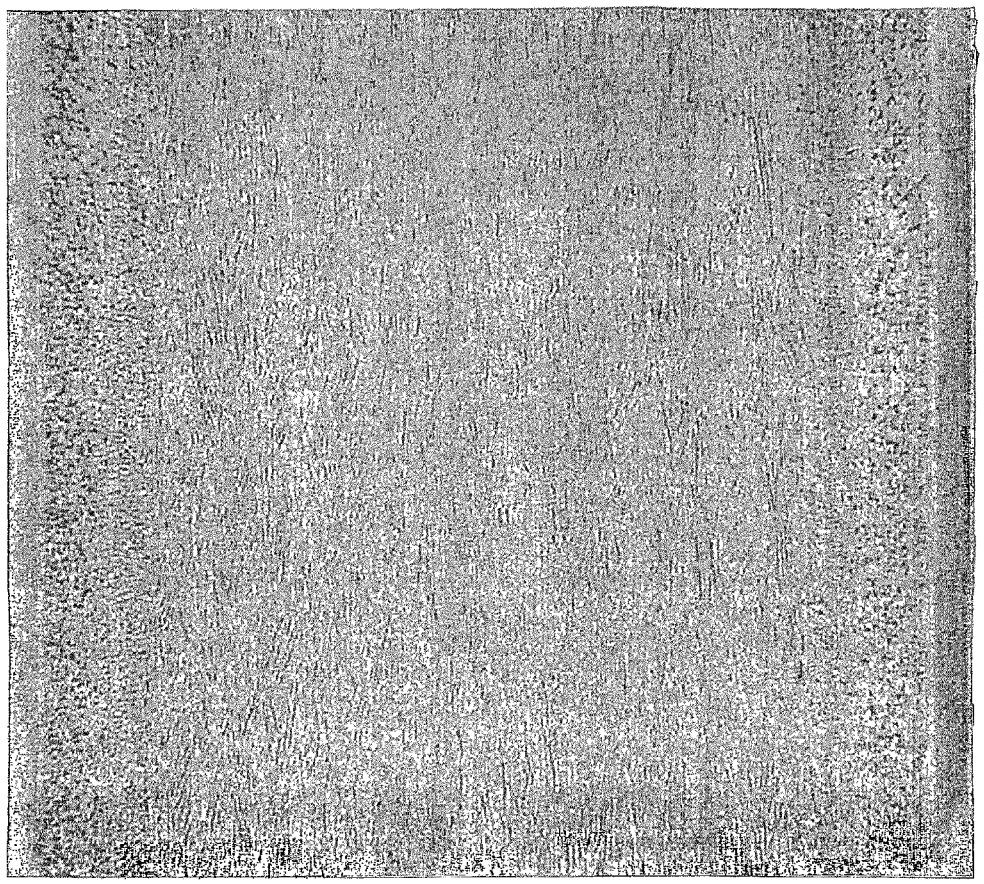
FIG. 9 is a photograph of the semiconductor film crystallized by the conventional laser annealing method.

Moreover, in order to compare, the semiconductor film is crystallized by a crystallizing method different from the above method. FIG. 9 is a photograph of the semiconductor film crystallized thus. According to this crystallizing method, two cylindrical lenses are used without using the slit, and the output power of the laser oscillator and the position of the cylindrical lens are adjusted so that the 250-μm-wide large crystal grain region, which is the same as that shown in FIG. 8, is formed.

Although the 250-μm-wide large crystal grain region is formed in FIG. 9, an inferior crystallinity region is formed at opposite ends of the region irradiated with the laser beam according to the following reason. Since the laser beam has Gaussian intensity distribution, a low-intensity part of the laser beam (opposite end portions of the beam spot) cannot melt the semiconductor film sufficiently. That is to say, in the method not providing the slit, both of the large crystal grain region and the inferior crystallinity region are formed because of the Gaussian intensity distribution of the laser beam. The large crystal grain region is formed by irradiating with the high-intensity part of the laser beam that can melt the semiconductor film completely. Meanwhile, the inferior crystallinity region is formed by irradiating with the low-intensity part of the laser beam that cannot melt the semiconductor film completely.

On the other hand, in the laser irradiation method of the present embodiment, the laser beam after passing through the slit is delivered to the semiconductor film through a lens provided so as to satisfy the predetermined condition. Therefore, the fringes due to the diffraction of the laser beam can be prevented from appearing on the semiconductor film, and the inferior crystallinity region can be reduced compared with the laser irradiation method not using the slit. In the case of forming the large crystal grain regions having the same width as shown in FIGS. 8 and 9, the wide inferior crystallinity region is formed at opposite ends of the crystalline region by the conventional method (FIG. 9). When the TFT is manufactured by using such an inferior crystallinity region as its active layer, the electric characteristic may vary and an error may occur in the operation. Therefore, it is necessary to form the TFT out of the inferior crystallinity region. In other words, the wide inferior crystallinity region interrupts the high integration of the TFTs. On the other hand, with the laser irradiation method of the present embodiment, the inferior crystallinity region is hardly formed at opposite ends of the large crystal grain region as shown in FIG. 8. Accordingly, the TFTs can be formed over the substrate with almost no interspace therebetween, and high integration of the TFT can be achieved. With the laser irradiation method of the present embodiment, the linear beam has narrow energy density distribution, and the variation of the crystallinity in the large crystal grain region is suppressed. Therefore, the laser irradiation method of the present embodiment can reduce the variation of the characteristic between the TFTs and can improve the characteristic of the device.

Consequently, by using the slit and two cylindrical lenses in combination with the high-power laser oscillator as described in this embodiment, it is possible to expand the large crystal grain region without expanding the inferior crystallinity region and to manufacture the wide large crystal grain region without varying the crystallinity. With the laser irradiation apparatus of the present embodiment, it is possible to improve the characteristic of the TFT and to integrate the TFTs.

Although the a-Si film formed over the glass substrate is irradiated with the laser beam in this embodiment, the structure of the irradiation object is not limited to this. Since the linear beam having the predetermined width is formed on the semiconductor film by using the slit in this embodiment, the width of the large crystal grain region does not change even though the irradiation object changes. For example, the laser irradiation may be performed to the substrate over which a base film and the a-Si film are formed or to the substrate over which a stripping layer, the a-Si film, and a wiring material are formed in order. In any way, the wide large crystal grain region can be manufactured.

Embodiment 5

Embodiment for Manufacturing a TFT

Figure 6A:
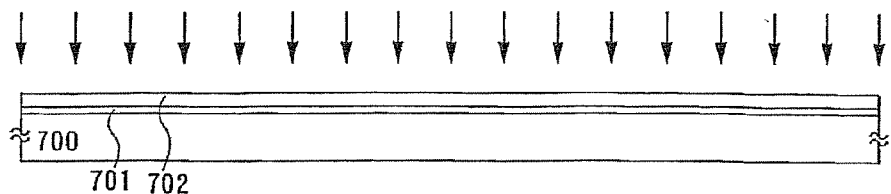
FIGS. 6A to 6D show the steps for forming a thin film transistor (TFT) by using the laser annealing apparatus.

This embodiment describes a process for manufacturing a thin film transistor (TFT) with the use of the laser irradiation apparatus of the present invention with reference to FIGS. 6A to 6D. First, as shown in FIG. 6A, a base film 701 is formed over a substrate 700. The substrate 700 may be, for example, a glass substrate made from bariumborosilicate glass or aluminoborosilicate glass, a quartz substrate, or a SUS substrate. In addition, although a substrate made of flexible synthetic resin such as acryl or plastic typified by PET, PES, PEN, or the like tends to be inferior in resistance against the heat to the other substrates, the substrate made of flexible synthetic resin can be used when it can resist the heat generated in the manufacturing process.

The base film 701 is provided in order to prevent alkali-earth metal or alkali metal such as Na included in the substrate 100 from diffusing into the semiconductor film. The alkali-earth metal and the alkali metal have an adverse affect on a characteristic of a semiconductor device when they are in the semiconductor. Therefore, the base film 701 is formed of an insulating film such as silicon oxide, silicon nitride, or silicon nitride oxide which can prevent the diffusion of alkali metal or alkali-earth metal into the semiconductor film. In the present embodiment, a silicon nitride oxide film is formed in thickness from 10 to 400 nm by a plasma CVD method. In the case of using the substrate including the alkali metal or the alkali-earth metal in any way such as the glass substrate or the plastic substrate, it is effective to provide the base film in terms of preventing the diffusion of the impurity. When the substrate such as a quartz substrate is used which hardly diffuses the impurity, the base film is not always necessary to be provided.

Figure 6B:
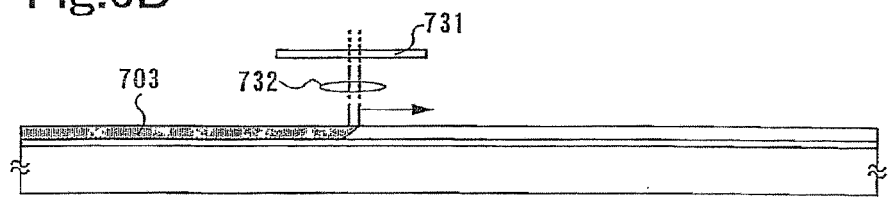

Next, an amorphous semiconductor film 702 is formed over the base film 701 in thickness from 25 to 100 nm (preferably from 30 to 60 nm). The amorphous semiconductor film 702 may be silicon or silicon germanium. Silicon is used in this embodiment. When the silicon germanium is used, the density of germanium is preferably from 0.01 to 4.5 atomic %. Next, as shown in FIG. 6B, the amorphous semiconductor film 702 is crystallized by the laser irradiation with the use of the laser irradiation apparatus of the present invention.

This embodiment employs a continuous wave $Nd:YVO_4$ laser providing 10 W at the second harmonic with the spatial profile of $TEM_{00}$. The first beam spot formed over the surface of the amorphous semiconductor film 702 by shaping the laser beam with the use of a slit 731 and a lens 732 is rectangular having a size of 10 μm in the short-side direction and 500 μm in the long-side direction. The laser beam is scanned over the amorphous semiconductor film 702 in a direction indicated by an arrow in FIG. 6B. The crystal grain grown in the scanning direction of the laser beam is formed by the laser irradiation.

By forming the crystal grain extending long in the scanning direction, a crystalline semiconductor film 703 having almost no crystal grain boundary in the channel direction of the TFT can be formed. Moreover, the linear laser beam having homogeneous intensity with no fringes due to the diffraction can be delivered to the irradiation surface by blocking a low-intensity part of the laser beam with the use of the slit 731.

Figure 6C:
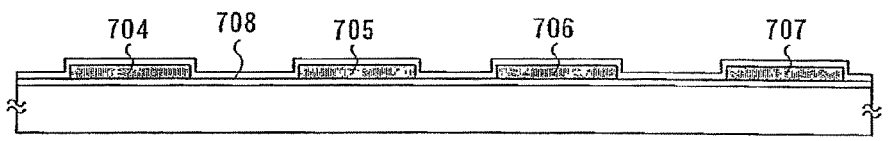

After that, the crystalline semiconductor film 703 is patterned as shown in FIG. 6C, and island-shaped semiconductor films 704 to 707 are formed. Then, various semiconductor elements typified by a TFT are formed by using the island-shaped semiconductor films 704 to 707. Moreover, a gate insulating film 708 is formed so as to cover the island-shaped semiconductor films 704 to 707. The gate insulating film 708 can be formed of, for example, silicon oxide, silicon nitride, or silicon nitride oxide by the plasma CVD method, the sputtering method, or the like. In this embodiment, the gate insulating film 708 is formed of the insulating material including silicon in 30 to 200 nm thick by the sputtering method.

Figure 6D:
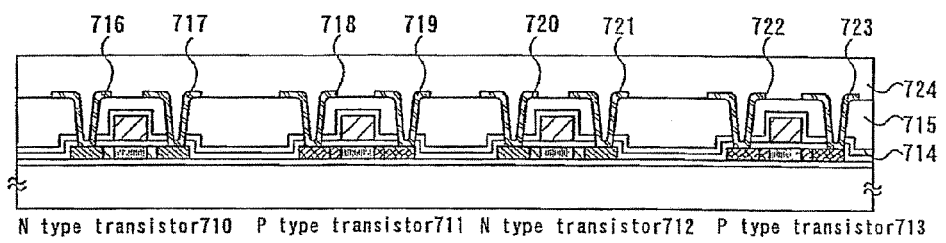

Next, a gate electrode is formed by forming and patterning a conductive film (not shown) over the gate insulating film. After that, a source region, a drain region, an LDD region, and the like are formed in such a way that an impurity imparting n-type or p-type conductivity is selectively added to the island-shaped semiconductor films 704 to 707 by using the patterned resist or the gate electrode as the mask. According to the above process, N-channel TFTs 710 and 712, and P-channel TFTs 711 and 713 can be formed over the same substrate (FIG. 6D). Subsequently, an insulating film 714 is formed as a protective layer for these TFTs. The insulating film 714 is formed of an insulating material including silicon in 100 to 200 nm thick by the plasma CVD method or the sputtering method. The insulating film 714 may be a single layer or multilayers. In this embodiment, the insulating film 714 is formed of silicon oxynitride in 100 nm thick by the plasma CVD method.

Then, an organic insulating film 715 is formed over the insulating film 714. The organic insulating film 715 is formed of polyimide, polyamide, BCB, acrylic, or the like by the SOG method. The insulating film 715 is preferably superior in flattening property because the insulating film 715 is formed for the purpose of relaxing the convexoconcavity due to the TFTs. Subsequently, a contact hole reaching the impurity region is formed by patterning the insulating film 714 and the organic insulating film 715 according to a photolithography method.

Next, wirings 716 to 723 are formed by forming and patterning a conductive film with the use of the conductive material. After that, an insulating film 724 is formed as a protective film. Thus, a semiconductor device shown in FIG. 6D is completed. It is noted that the method for manufacturing the semiconductor device by the laser irradiation method of the present invention is not limited to the above-mentioned method for manufacturing the TFT. In the present invention, the crystalline semiconductor film obtained by the laser irradiation method is used as an active layer of the TFT. Accordingly, the variation of the mobility, the threshold value, and the on-current between the semiconductor elements can be suppressed. The condition of the laser irradiation is not limited to that shown in this embodiment.

In addition, a crystallization step using a catalyst element may be provided before the crystallization step by the laser irradiation. In this embodiment, nickel (Ni) is used as the catalyst element. Besides, the catalyst element may be, for example, germanium (Ge), iron (Fe), palladium (Pd), tin (Sn), lead (Pb), cobalt (Co), platinum (Pt), copper (Cu), or gold (Au). The laser irradiation melts an upper part of the semiconductor film but does not melt a lower part of the semiconductor film. Therefore, a crystal remained without being melted in the lower part of the semiconductor film becomes a crystal nucleus, and the crystallization is promoted uniformly from the lower part toward the upper part of the semiconductor film.

Compared to the case in which the semiconductor film is crystallized only by the laser beam, it is possible to enhance the crystallinity of the semiconductor film further and to suppress the roughness of the surface of the semiconductor film after the laser crystallization. Therefore, the variation of the characteristic of the semiconductor element to be formed afterward typified by a TFT can be suppressed more and the off current can be also suppressed. It is noted that the crystallization may be performed in such a way that the heat treatment is performed after the catalyst element is added in order to promote the crystallization and then the laser beam is irradiated in order to enhance the crystallinity further. Alternatively, the heat treatment may be omitted. Specifically, after adding the catalyst element, the semiconductor film may be irradiated with the laser beam instead of the heat treatment to enhance the crystallinity.

Although the present embodiment described an example in which the laser irradiation method of the present invention is used to crystallize the semiconductor film, the laser irradiation method may be applied to activate the impurity element doped in the semiconductor film. The method for manufacturing the semiconductor device of the present invention can be applied to the method for manufacturing the integrated circuit and the semiconductor display device. A transistor used for a functional circuit such as a driver or a CPU preferably has an LDD structure or a structure in which the LDD region overlaps the gate electrode. It is also preferable to miniaturize the transistor for higher-speed operation. Since the transistors 710 to 713 manufactured according to this embodiment have the LDD structure, they are preferably used in the driver circuit requiring high-speed operation.

Figure 7A:
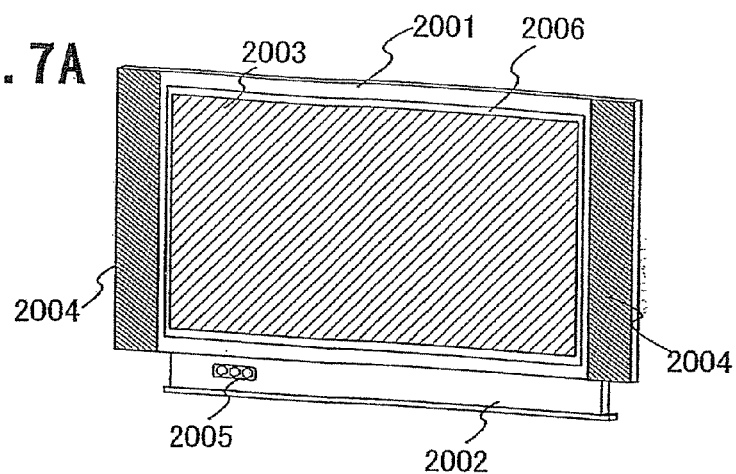
FIGS. 7A to 7C show display devices manufactured by the laser annealing method of the present invention.
Figure 7B:
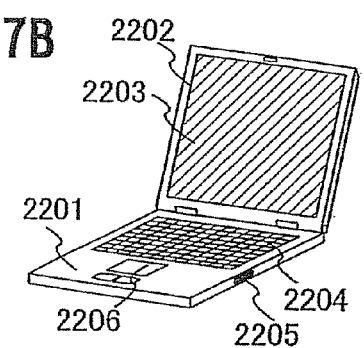
Figure 7C:
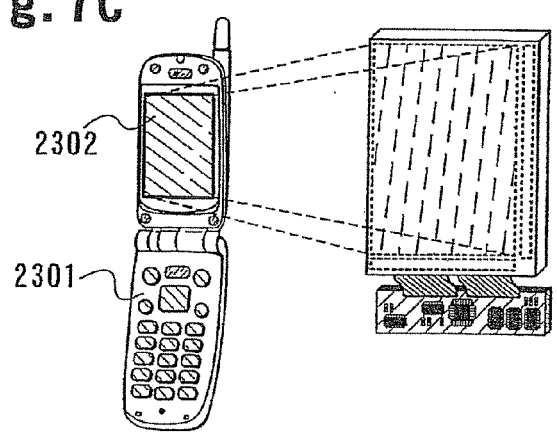

According to the present invention, various electronic instruments can be manufactured with the use of the thin film transistor shown in FIG. 6D. Specific examples are illustrated in FIGS. 7A to 7C. FIG. 7A shows a display device including a chassis 2001, a supporting stand 2002, a display portion 2003, a speaker portion 2004, a video input terminal 2005, and the like. The display device can be manufactured by using the thin film transistor formed by the manufacturing method shown in FIGS. 6A to 6C in the display portion 2003. The display device includes a liquid crystal display device and a light-emitting device, and specifically includes all the information display devices for a computer, a TV broadcast reception, advertisement, and the like.

FIG. 7B is a computer including a chassis 2200, a display portion 2201, a keyboard 2203, an external connection port 2204, a pointing mouse 2205, and the like. The manufacturing method shown in FIGS. 6A to 6D can be applied to the display portion 2201 and the circuits. Moreover, the present invention can be applied to the semiconductor device such as the CPU and the memory inside the computer. FIG. 7C shows a mobile phone as an example of a mobile terminal, including a chassis 2301, a display portion 2302, and the like. Since the electronic instruments such as a digital camera or a PDA typified by the mobile phone is the mobile terminal, the display screen is small. Therefore, miniaturization and weight-saving can be achieved by forming the functional circuit such as the CPU with the use of the small transistor shown in FIG. 6D.

Moreover, the thin film transistor manufactured by this embodiment can be used as the ID chip. For example, the thin film transistor can be used as the integrated circuit or the memory in the ID chip by using the manufacturing method shown in FIGS. 6A to 6D. When the transistor is used as the memory, the circulation process of products can be recorded in the memory. By recording the process in the production step of the products, it becomes easy for wholesalers, retailers, and consumers to know the production area, the producer, the date of manufacture, the processing method, and the like.

INDUSTRIAL APPLICABILITY

As thus described, the semiconductor device manufactured by the present invention can be applied in a wide range, and the semiconductor device manufactured by the present invention can be applied to the electronic instruments of every field.

EXPLANATION OF REFERENCE 101 laser oscillator, 102 slit, 103 mirror, 104 cylindrical lens, 105 cylindrical lens, 106 semiconductor film, 107 glass substrate, 108 X-stage, 109 Y-stage, 301 laser oscillator, 302 slit, 303 mirror, 304 cylindrical lens, 305 cylindrical lens, 306 semiconductor film, 307 glass substrate, 308 X-stage, 309 Y-stage, 401 laser oscillator, 402 mirror, 403 convex spherical lens, 404 slit, 405 convex spherical lens, 406 semiconductor film, 407 glass substrate, 408 X-stage, 409 Y-stage, 700 glass substrate, 701 base film, 702 amorphous semiconductor film, 703 crystalline semiconductor film, 704 semiconductor film, 705 semiconductor film, 706 semiconductor film, 707 semiconductor film, 708 gate insulating film, 710 TFT, 711 TFT, 712 TFT, 713 TFT, 714 insulating film, 715 organic insulating film, 716 wiring, 717 wiring, 718 wiring, 719 wiring, 720 wiring, 721 wiring, 722 wiring, 723 wiring, 731 slit, 732 lens, 2001 chassis, 2002 supporting stand, 2003 display portion, 2004 speaker portion, 2005 video input terminal, 2200 chassis, 2201 display portion, 2203 keyboard, 2204 external connection port, 2205 pointing mouse, 2301 chassis, 2302 display portion.

What is claimed is:

1. A laser irradiation method comprising:
blocking a low-intensity part of a first laser beam emitted from a laser oscillator which is either a YAG laser or a YVO$_4$ laser to form a second laser beam, by making the first laser beam pass through a slit;
bending a traveling direction of the second laser beam by a predetermined angle by a mirror; and
projecting an image formed at the slit to an irradiation surface by a convex cylindrical lens,
wherein the second laser beam is shaped into a linear beam on the irradiation surface,
wherein the slit, the convex cylindrical lens, and the irradiation surface are arranged so that a distance (M1) between the slit and the convex cylindrical lens and a distance (M2) between the convex cylindrical lens and the irradiation surface satisfy following equations 1 and 2:

$$M1 = f(s+D)/D \qquad \text{[Equation 1]}$$

$$M2 = f(s+D)/s \qquad \text{[Equation 2]}$$

where s is a width of the slit, D is a length of the linear beam in a long-side direction, and f is a focal length of the convex cylindrical lens,
wherein the mirror is provided between the slit and the convex cylindrical lens,
wherein the convex cylindrical lens acts in the long-side direction of the linear beam, and
wherein the slit acts in the long-side direction of the linear beam.

2. The laser irradiation method according to claim 1, wherein a second convex cylindrical lens is provided between the convex cylindrical lens and the irradiation surface in such a way that the second convex cylindrical lens is rotated by 90° from the convex cylindrical lens.

3. A laser irradiation apparatus comprising:
a laser oscillator which is either a YAG laser or a YVO$_4$ laser;
a slit for blocking a low-intensity part of a first laser beam emitted from the laser oscillator to form a second laser beam;

a mirror for bending a traveling direction of the second laser beam by a predetermined angle; and a convex cylindrical lens for projecting to an irradiation surface an image formed at the slit in which the low-intensity part is blocked, wherein the second laser beam is shaped into a linear beam on the irradiation surface, wherein the slit, the convex cylindrical lens, and the irradiation surface are arranged so that a distance (M1) between the slit and the convex cylindrical lens and a distance (M2) between the convex cylindrical lens and the irradiation surface satisfy following equations 1 and 2:

$$M1 = f(s+D)/D \qquad \text{[Equation 1]}$$

$$M2 = f(s+D)/s \qquad \text{[Equation 2]}$$

where s is a width of the slit, D is a length of the linear beam in a long-side direction, and f is a focal length of the convex cylindrical lens, wherein the mirror is provided between the slit and the convex cylindrical lens, wherein the convex cylindrical lens acts in the long-side direction of the linear beam, and wherein the slit acts in the long-side direction of the linear beam.

4. The laser irradiation apparatus according to claim 3, wherein a second convex cylindrical lens is provided between the convex cylindrical lens and the irradiation surface in such a way that the second convex cylindrical lens is rotated by 90° from the convex cylindrical lens.

5. A laser irradiation method comprising:

blocking a low-intensity part of a first laser beam emitted from a laser oscillator which is either a YAG laser or a $YVO_4$ laser to form a second laser beam, by making the first laser beam pass through a slit;

bending a traveling direction of the second laser beam by a predetermined angle by a mirror; and projecting an image formed at the slit to an irradiation surface by a convex spherical lens, wherein the second laser beam is shaped into a linear beam on the irradiation surface, wherein the slit, the convex spherical lens, and the irradiation surface are arranged so that a distance (M1) between the slit and the convex spherical lens and a distance (M2) between the convex spherical lens and the irradiation surface satisfy following equations 1 and 2:

$$M1 = f(s+D)/D \qquad \text{[Equation 1]}$$

$$M2 = f(s+D)/s \qquad \text{[Equation 2]}$$

where s is a width of the slit, D is a length of the linear beam in a long-side direction, and f is a focal length of the convex spherical lens, wherein the mirror is provided between the slit and the convex spherical lens, wherein the convex spherical lens acts in the long-side direction of the linear beam, and wherein the slit acts in the long-side direction of the linear beam.

* * * * *